United States Patent [19]

Pauza et al.

[11] 3,753,211

[45] Aug. 14, 1973

[54] CONNECTING MEANS FOR CERAMIC SUBSTRATE PACKAGE

[75] Inventors: William Vito Pauza, Palmyra, Pa.; John Franklin Smith, III, Menlo Park, Calif.

[73] Assignee: AMP Incorporated, Harrisburg, Pa.

[22] Filed: Oct. 6, 1971

[21] Appl. No.: 186,876

[52] U.S. Cl. ...... 339/75 MP, 339/17 CF, 339/91 R, 339/95 R, 339/176 MP

[51] Int. Cl. ............ H01r 13/54

[58] Field of Search ............ 339/17, 75, 91, 95, 339/176

[56] References Cited

UNITED STATES PATENTS

| | | | |
|---|---|---|---|
| 3,391,383 | 7/1968 | Antes | 339/17 CF |
| 2,857,577 | 10/1958 | Vanderpool | 339/75 MP |
| 3,293,590 | 12/1966 | Woosey, Jr. | 339/36 |
| 3,297,974 | 1/1967 | Pittman | 339/17 CF |
| 3,391,382 | 7/1968 | Leibovitz | 339/17 CF |
| 3,656,183 | 4/1972 | Walterscheid | 339/17 CF |

*Primary Examiner*—Joseph H. McGlynn
*Attorney*—William J. Keating, Gerald K. Kita, John R. Flanagan and Allan B. Osborne

[57] ABSTRACT

Multi-contact connector for ceramic substrate integrated circuit assembly comprises a housing, adapted to receive the substrate, and a cover member. The housing contains two rows of contact terminals and supporting surface portions for supporting the substrate between the two rows of terminals. The cover member, when assembled to the housing, causes the contact portions of the terminals to move to and fro across the terminal pads on the substrate thereby to achieve a wiping action at the electrical interface.

8 Claims, 9 Drawing Figures

Patented Aug. 14, 1973 3,753,211

4 Sheets-Sheet 4

CONNECTING MEANS FOR CERAMIC SUBSTRATE PACKAGE

BACKGROUND OF THE INVENTION

Integrated circuit devices are commonly mounted on relatively thin ceramic plates, commonly referred to as substrates, which have conductors thereon extending from the integrated circuit device or "chip" to the marginal portions of one face of the substrate. Enlarged contact areas or contact pads are formed at the ends of the substrate conductors on one of the faces of the substrate for connecting these substrate conductors to external conductors. The substrate conductors are commonly connected to the external conductors by multicontact electrical connectors and a variety of types of connectors have been developed for use with previously known designs of ceramic substrates.

More recently, and for reasons dictated by substrate manufacturing considerations and other reasons, substrates have been introduced which have their contact pad portions located on their sides rather than on their faces. Presently known connectors, which were designed for substrates of the type having terminal pads on their faces, cannot be used with these newly developed types of substrates and cannot be adapted for use with side contact substrates.

It is an object of the present invention to provide a connecting device for ceramic substrates having contact pads on their sides. It is a further object to provide a contact device which will occupy a minimum amount of space in a circuit assembly. A further object is to provide a connecting device for ceramic substrate which is simple in construction, which can be inexpensively manufactured, and which will insure effective electrical contact with each of the terminal pads on a ceramic substrate. A further object is to provide a connecting device for a ceramic substrate which can be assembled to a printed circuit board under confined working conditions. A further object is to provide a substrate connector having means for moving the contact portions of its terminals over the contact pads of the substrate when the substrate is assembled to the connecting device thereby to achieve a wiping action of the contact areas and a resulting low resistance connection.

These and other objects of the invention are achieved in a preferred embodiment thereof which briefly described in the foregoing abstract, which is described in detail below, and which is shown in the accompanying drawing in which:

FIG. 8 is a perspective exploded view of an alternative form of connector in accordance with the invention.

Figures 1, 2:
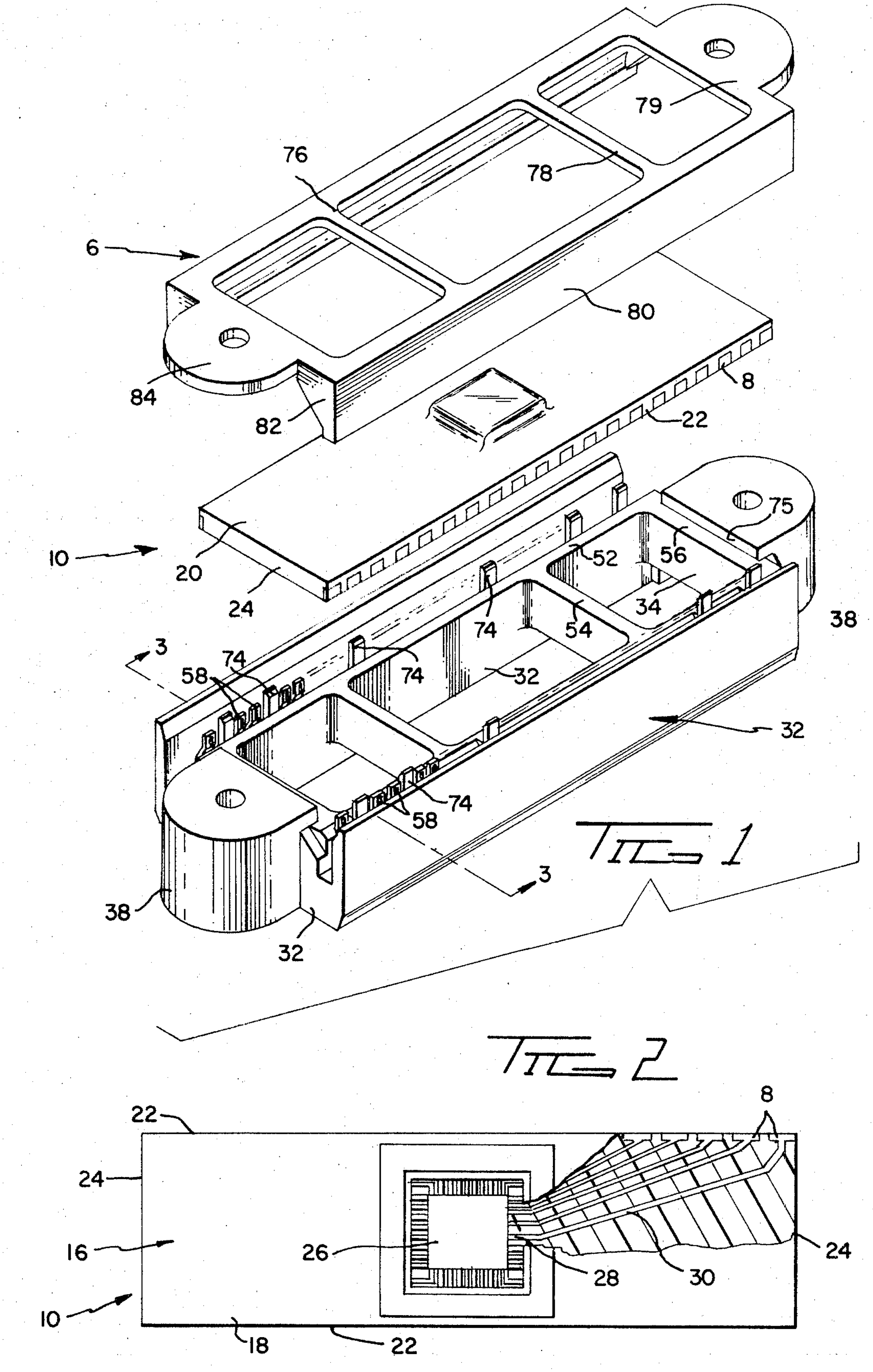
FIG. 1 is a perspective exploded view of a connecting device in accordance with the invention showing a ceramic substrate located between the housing and cover portions of the connecting device.
FIG. 2 is a plan view with parts broken away of one side of a ceramic substrate of the type for which the connecting device of the instant invention is intended.
Figure 4:
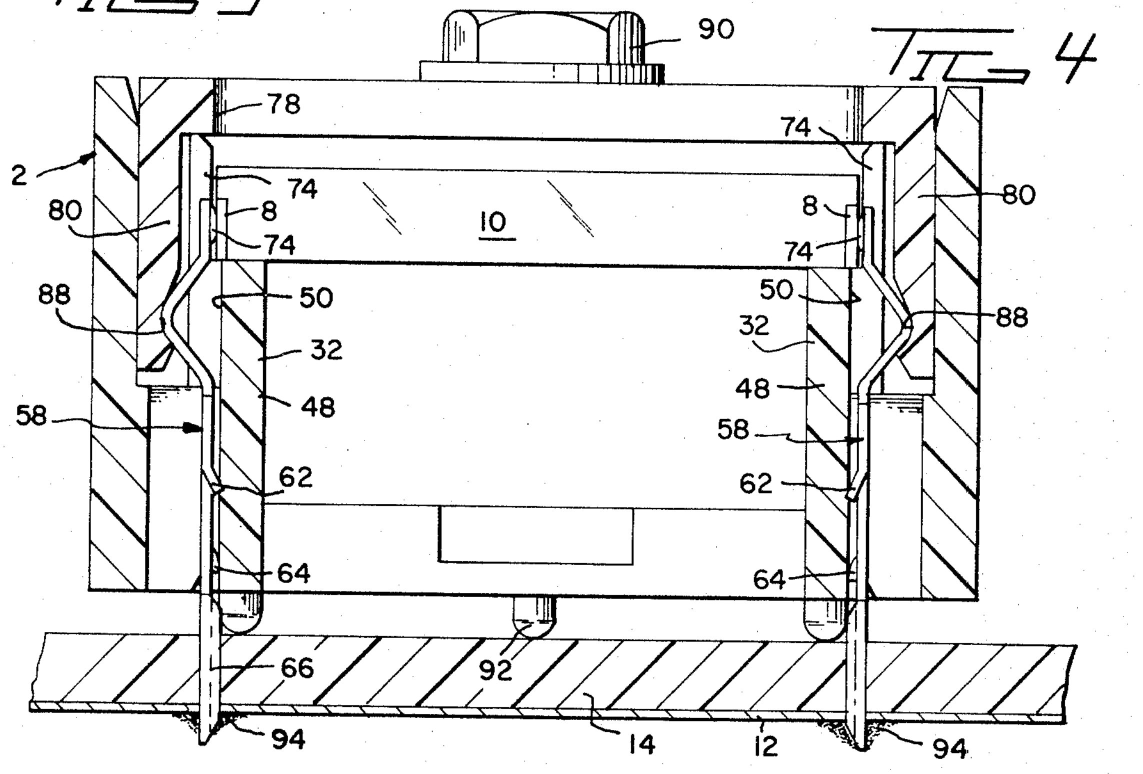
FIG. 4 is a view similar to FIG. 3 but illustrating the positions of the parts after the substrate and the cover member have been assembled to the connector housing.

Referring first to FIG. 2, the connector of the instant invention serves the function of connecting the terminal pads 8 of a ceramic substrate 10 to external conductors such as the conductors 12 on one side of a printed circuit board 14 as shown in FIG. 4. The substrate 10 comprises a generally rectangular ceramic body 16 having parallel faces 18, 20, sides 22, and ends 24. A well 26 is centrally located on the face 18 and is adapted to receive an integrated circuit device, this well resulting in the formation of a projection on the other face 20 as shown in FIG. 1. Inner bonding pads 28 are located around the well 26 so that the contact portions of the integrated circuit or chip can be connected, as by wire bonding, to these inner bonding pads. Conductors 30, contained in the ceramic body 16, extend from these bonding pads to the previously identified terminal pads 8 on the sides 22 of the substrate. As previously noted, the provision of terminal pads on the thin sides of a substrate has not been common in the past, previous practice having been to locate these pads on one of the faces 18, 20.

A preferred form of connector 2, in accordance with the invention comprises a base or housing 4 and a cover 6. The ceramic substrate 10 is mounted in the base with its terminal pads 8 in electrical contact with terminals in the base as described below. The housing 4 is generally rectangular having elongated parallel sidewalls 32 and relatively short endwalls 34. The sidewalls are connected by integral ribs 36 so that the housing 4 is centrally open to facilitate dissipation of the heat generated in the chip and to minimize the amount of material in the housing. Bosses 38 extend outwardly from the endwalls 34 and are provided with openings by means of which the cover member 6 can be secured to the housing.

The housing 4 and the cover 6 may be manufactured by injection molding methods from any suitable plastic material, a glass filled nylon being preferred under many circumstances by reason of its relatively low cost, its durability and the ease with which it can be molded into intricate shapes. Specifically, the glass filled nylon supplied by Bodische Anilin and Soda Fabrik, A. G. of Ludwidshafen Am Rhein under the designation A3XG5 has proved highly satisfactory.

Figure 3:
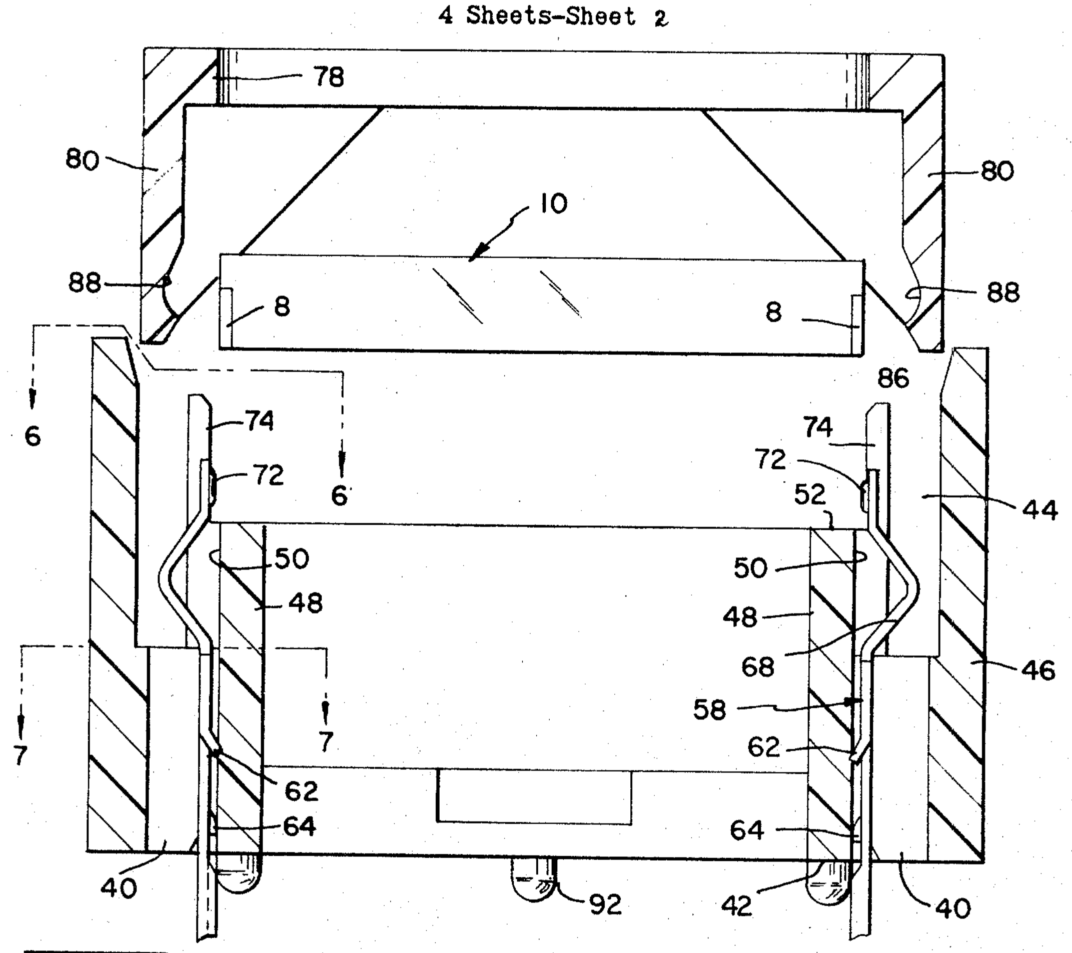
FIG. 3 is a sectional view taken along the lines 3—3 of FIG. 1.
Figures 5, 6:
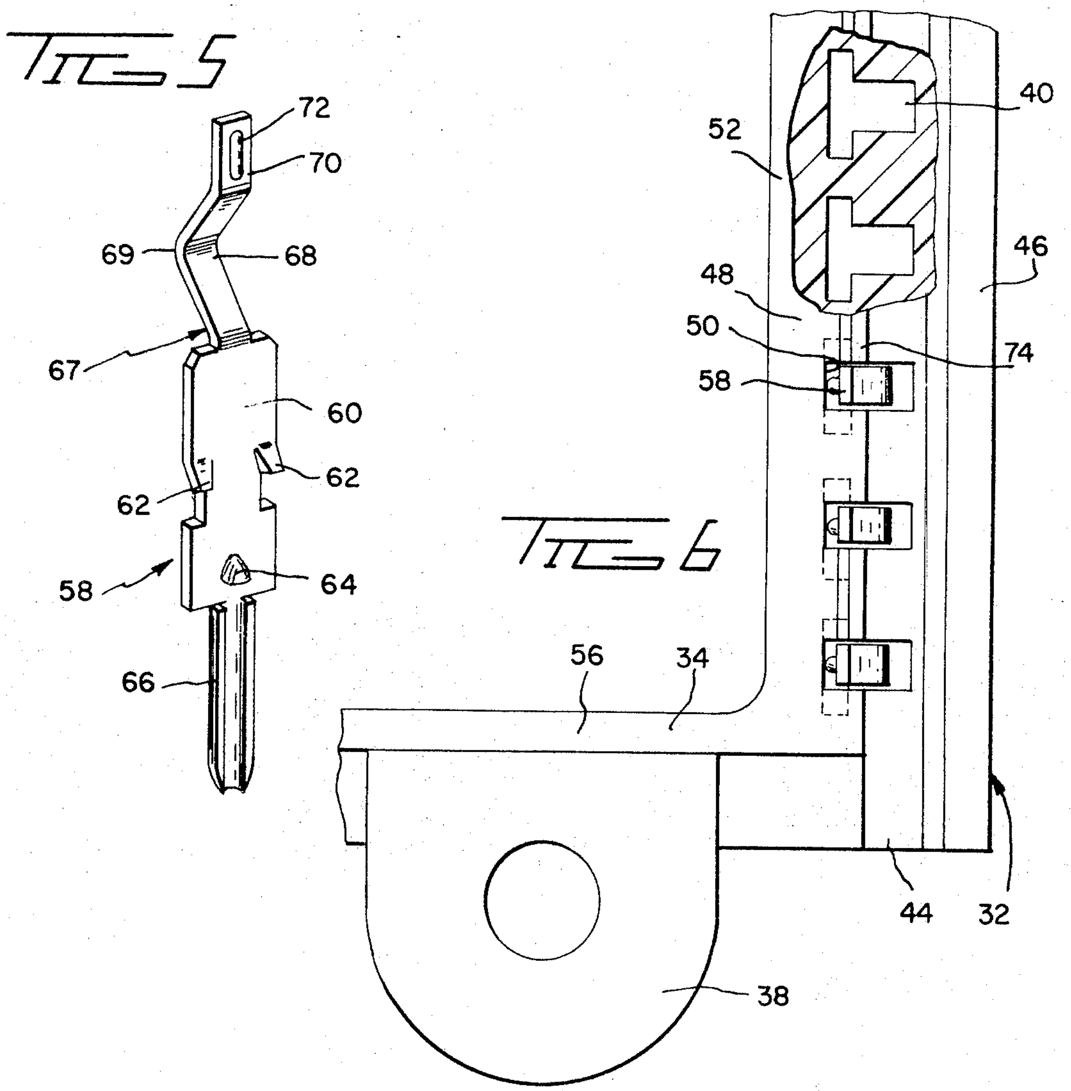
FIG. 5 is a perspective view of a contact terminal of the type adapted to be mounted in a connector in accordance with the invention.
FIG. 6 is a fragmentary plan view taken along the lines 6—6 of FIG. 3 of the housing section of the connector in accordance with the invention.
Figure 7:
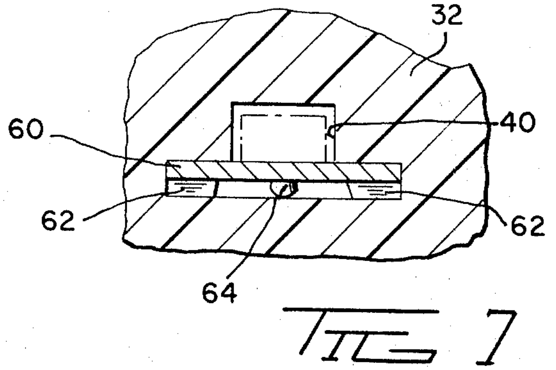
FIG. 7 is a view taken along the lines 7—7 of FIG. 3.

As best shown in FIGS. 3, 6 and 7, a plurality of generally T-shaped cavities 40 extend upwardly from the underside 42 of the housing in the sidewalls 32 and open into recesses 44 which extend uninterruptedly along the full length of each sidewall. The cavities 40 separate the sidewalls 32 into outer sections 46 and inner sidewall sections 48, the inner sidewall sections having upper ends 52 which are substantially below the upper ends of the outer sidewall sections 46. Grooves 50 are provided at spaced apart intervals in the inner sidewall sections in alignment with the cavities 40 for the accommodation of the terminal members 58 described below. The upper ends 52 of the inner sidewall sections 48 are co-planar with the upper ends 54 of the ribs 36 and the upper ends 56 of the endwalls 34 to provide substrate supporting surfaces. It will also be noted that guide posts 74 are provided at intervals along the surfaces 52 for guiding a substrate into the housing as will be subsequently described.

As shown in FIG. 5, each of the terminals 58 has a central flat body portion 60 from which tangs or lances 62 are struck and on which an embossment 64 is formed at its lower end. A solder post 66 extends downwardly from the lower end of the body section and a contact arm 67 of reduced width, relative to the body section, extends upwardly from this section. The contact arm is formed outwardly and inwardly as shown at 68 to define a knee 69 which is offset from the plane of the central body section 60. The contact arm 67 has a contact portion 70 at its upper end which is co-planar with body section 60 and which may be embossed as shown at 72 to define a precise contact area.

The individual contact terminals are inserted into the cavities 40 from the underside 42 of the housing until the end of the contact tip sections are at the level of the substrate supporting services 52, 54 and 56. The tangs or lances 62 bite into the walls of the cavities 40 to retain the contacts in their respective cavities. The bosses 64 in cooperation with the tangs 62 prevent any rocking motion of the contact terminals. It will be noted from FIG. 3 that the upper ends of the terminals are disposed below the upper ends of the guide posts 74 so that the ceramic substrate will be precisely located in a plane parallel to the plane of the surfaces 52, 54, 56 before it is moved into engagement with the terminals.

The cover member 6 has a top section 76 which, like the housing, is not continuous but is formed by transversely extending ribs 78 in order to permit heat dissipation. Flanges 80 are provided on the sides of the top section and are preferably connected to the end ribs 79 by gusset sections 82 in order to strengthen these flanges against outward flexure when the cover is assembled to the housing. Ears 84 are formed integrally with these end ribs 79 so that the cap section can be secured to the housing by suitable fasteners 90 as shown in FIG. 4. The lower ends of the flanges 80 are bevelled as shown at 86 on their inner edges, these bevels merging with pockets 88 which are dimensioned to receive the outwardly formed sections 68 of the terminals as will be described below.

In use, the connector assembly will be supplied to the circuit manufacturer in unassembled condition as shown in FIG. 1. The housing 4 is first located on the printed circuit board 12 as shown in FIG. 3 and supported above the surface of the board by suitable legs 92 with the post portions 94 of the terminals extending downwardly through openings in the printed circuit board. The terminals are then soldered to the conductors 12 as shown at 94 and the housing is securely and accurately located on the board.

The ceramic substrate 10 is then located above the housing as shown in FIG. 3 and moved downwardly until it rests upon the surfaces 52, 54, 56. During such downward movement of the substrate, the guide posts 74 and the inwardly facing surfaces 75 of the bosses 38 serve to center the substrate and guide it between the opposed contact end portions 70 of the two rows of terminals 58. As shown in FIG. 3, the surfaces of the embossments 72 of the terminals are located slightly inwardly of the surfaces of the guide posts 74 so that the terminals will be flexed outwardly by a slight amount when the substrate is positioned in the housing.

After the substrate has been positioned on the support surfaces 52, 54, 56, the cover 6 is fitted onto the housing. During assembly of the cover, the lower ends of the flanges are moved past the terminals and the bevelled inner edges 86 engage the knees 69 of the contacts. The beveled surfaces 86 function as camming surfaces and flex the outwardly deformed portions 68 slightly so that the contact surfaces 72 move upwardly over the terminal pads 8 of the substrate. Upon further downward movement of the cover member, the outwardly formed sections of the terminals will be received in the pockets 88 of the flanges 80 so that the contact surfaces 72 move downwardly and return to their normal positions. This relative movement of the contact portions 72 of the terminals over the contact pads 8 of the substrate has the effect of rubbing the contact areas over each other so that clean, fresh contact surfaces are formed in the electrical interface. The cover member is finally secured to the housing by a suitable fastener 90 as previously described.

It will be apparent from the foregoing that the invention permits the achievement of effective electrical contact with terminal pads on the sides of a ceramic substrate. Moreover, the overall dimensions of the complete connector assembly are only slightly greater than the overall dimensions of the substrate 10 so that substrates can be mounted very close to each other on a printed circuit board. A further advantage of the invention is that the connector can be serviced from above as view in FIGS. 3 and 4; that is, it can be assembled to the board from above and the individual ceramic substrates in an array of connectors can be removed from, or assembled to, the connectors from above. Since the technician servicing the printed circuit board performs all of the necessary operations from above, and not from one side of the connector, the connectors can be located against each other on the printed circuit board. Finally, and as mentioned above, the flexure of the terminals ensure that clean surface will be provided at the electrical interface and any thin film of contaminants will be removed.

An additional advantage of the disclosed embodiment is that the terminals in the housing are protected during shipment and handling and after assembly of the cover member to the housing. The sidewall sections 46 extend beyond the terminals so that the terminals would not be damaged if the housing should be dropped or if an object should fall on the housing before it is put to use. After assembly of the cover to the housing, the cover member prevents flat pieces of wire or other foreign matter from dropping among the terminals and causing unwanted circuits between terminals.

Figure 9:
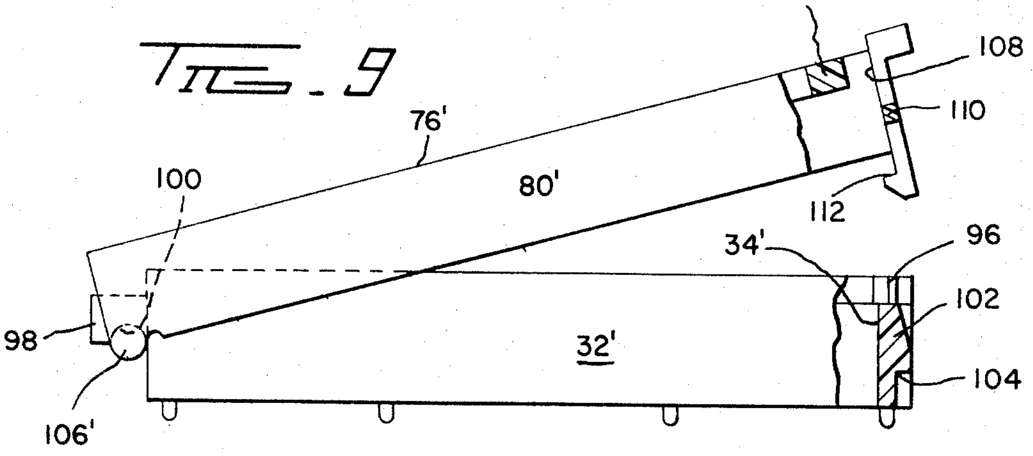
FIG. 9 is a side view of a connector of the type shown in FIG. 8.
Figure 6:
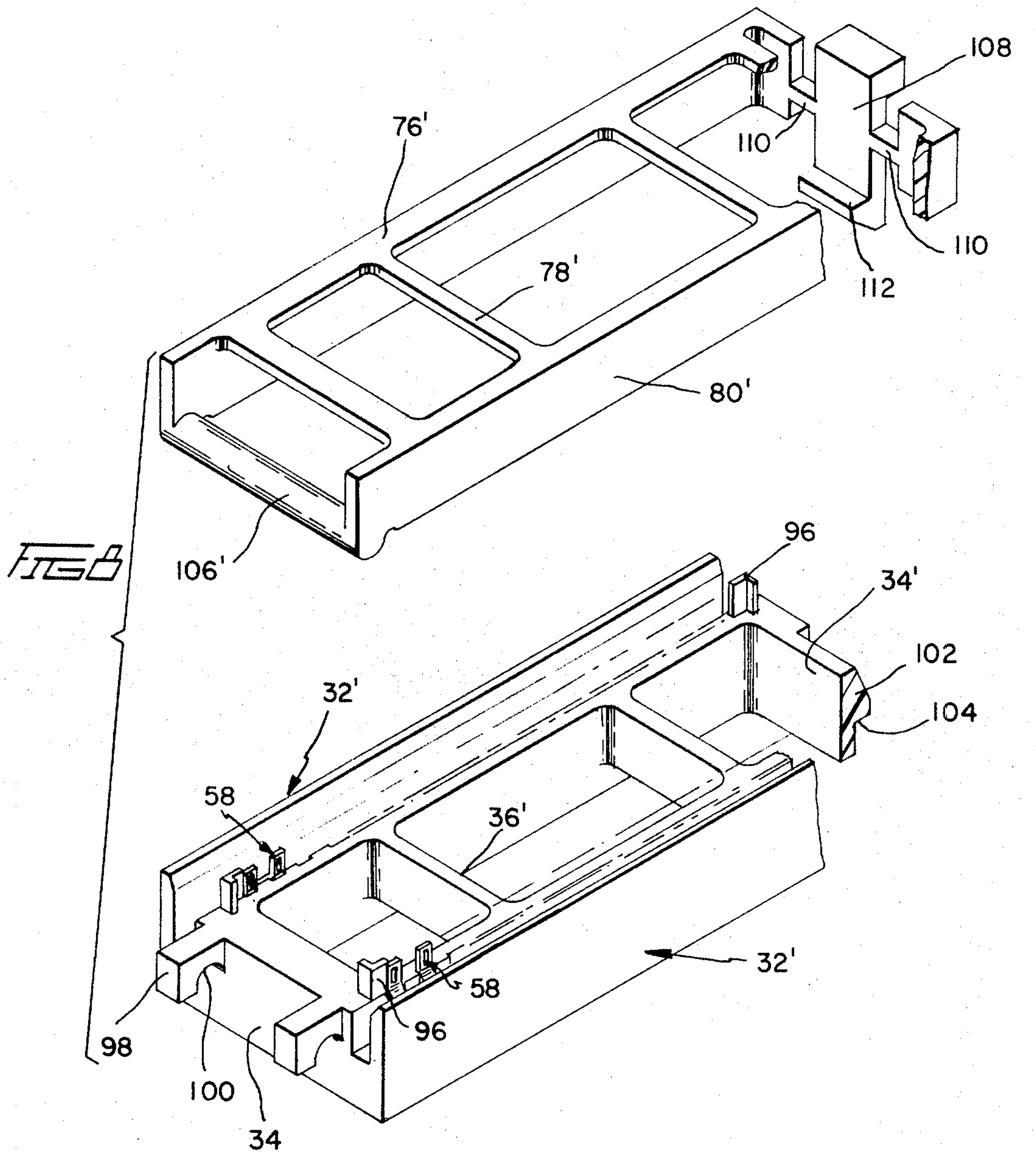

FIGS. 8 and 9 show an alternative embodiment of the invention which is similar, in many respects, to the embodiment of FIGS. 1–7. Accordingly, the same reference numerals, differentiated by marks, are used to denote the common structional features of the two embodiments. The embodiment of FIGS. 8 and 9 thus has sidewalls 32′, endwalls 34′, ribs 36′, and the previously described cavities 40′ containing terminals of the type shown in FIG. 5. L-shaped guide ribs 96 are provided at each corner of the housing in addition to the guide ribs 74′, the corner guides 96 being required because of the fact that the embodiment of FIG. 8 does not have the guide surfaces 75.

The embodiment of FIGS. 8 and 9 differs from the previously described embodiment in that a pair of spaced-apart hinge arms 98 extend from the lefthand endwall of the housing 4', each of these hinge arms having a downwardly facing semi-circular bearing recess 100. The housing is also provided with a latch dog 102 in its righthand endwall which has a downwardly facing shoulder 104. The cover member 6' has an integral hinge pin 106 on the lower side of its lefthand end extending between the flanges 80' and has a latch arm or latch lever 108 on its righthand end. This latch lever or latch arm is connected to the righthand ends of the flanges 80 by two relatively thin connecting sections 110 so that arm 108 can be pivoted outwardly from its normal position as shown in the drawings. An upwardly facing shoulder 112 is formed on this arm and located for engagement with the downwardly facing shoulder 104 of the dog 102.

The cover 6' is assembled to the housing 4' after the ceramic substrate has been positioned on the supporting surfaces 52, 54', 56 by merely cocking the cover relative to the housing and moving the hinge pin 106 against the recesses 100 of the hinge arms 98. The cover member is then moved arcuately downwardly until the latch arm 108 moves over the dog 102 and the shoulders 104, 112 are against each other. If it is subsequently necessary to remove the cover, the latch arm 108 is pivoted counterclockwise to disengage shoulder 112 from shoulder 104 and then swinging the cover in a counterclockwise direction relative to the housing.

The embodiment of FIGS. 8 and 9 does not require separate fasteners as does the previously described embodiment and may be preferred by some for this reason. Additionally, it will be apparent that as the cover is swung downwardly towards the housing, the contact terminals will not be all flexed at one time but will be sequentially flexed. The force required to assemble the housing cover 6' to the housing 4' is thus substantially less than the force required to assemble the cover 6 to the housing 4. This reduction in force is particularly desirable where a large number of terminals (in excess of the 40 terminals of the disclosed embodiment) are contained in the housing.

It will, therefore, be appreciated that the aforementioned and other desirable objects have been achieved; however, it should be emphasized that the particular embodiments of the invention, which are shown and described herein, are intended as merely illustrative and not as restrictive of the invention.

We claim:

1. A multi-contact electrical connector for supporting a ceramic substrate or the like on a panel-like member and for connecting terminal pads on the sides of said substrate to external conductors, said connector comprising:

a housing adapted to be supported on said panel-like member, said housing having supporting surface portions on one side thereof for supporting said substrate in parallel relationship to, and spaced from, said panel-like member, two rows of electrical terminals in said housing, said rows being spaced-apart by a distance which is substantially equal to the width of said substrate and the terminals in each of said rows being spaced apart by distances equal to the spacing between said terminal pads, said supporting surface portions being between said rows, said terminals extending normally of said supporting surface portions of said housing and having a contact portion on one end thereof, said one end of each terminal being located beyond said supporting surface portions so as to engage a contact pad on a substrate supported on said supporting surface portions, said terminals having a laterally formed section which extends outwardly with respect to said supporting surface portions, said terminals extending through said housing to the side thereof which is opposite to said one side and having means for forming an electrical connection to one of said external conductors, a cover adapted to be assembled to said housing in covering relationship to a substrate supported on said supporting surface portions, said cover having surface portions which are engageable with said laterally formed sections of said terminals, said surface portions being effective to resiliently flex said laterally formed sections during assembly of said cover to said housing thereby to cause relative movement of said contact portions of said terminals over said terminal pads and cleaning of the electrical interface between said contact portions and said pads, and means for securing said cover to said housing.

2. A multi-contact electrical connector as set forth in claim 1 including fastener means for securing said cover to said housing.

3. A multi-contact electrical connector as set forth in claim 1, said housing and said cover being of molded plastic material, said housing and said cover having integrally molded latching means thereon for securing said cover to said housing.

4. A multi-contact electrical connector as set forth in claim 1, said housing having hinge pin bearing means at one end thereof and having a latch dog on its end which is opposite to said one end, said cover having a hinge pin on one end thereof and having a latching arm on its end which is opposite to said one end whereby, said cover can be assembled to said housing by locating said hinge pin on said bearing means and pivotally moving the said other end of said cover towards said other end of said housing until said latching arm engages said latch dog.

5. A multi-contact electrical connector as set forth in claim 4 wherein said housing and said cover are of molded plastic material and said bearing means being integrally molded with said housing, said hinge pin and said latching arm being integrally molded with said cover.

6. A multi-contact connector for connecting the terminal pads on the sides of a ceramic substrate to the conductors on a panel-like member such as a printed circuit board, said connector comprising:

a housing adapted to be supported on said printed circuit board, said housing having substrate supporting surface portions for supporting said substrate in parallel relationship to, and spaced from, said printed circuit board, two rows of electrical terminals in said housing, said rows being spaced apart by a distance substantially equal to the width of said substrate and the terminals in each of said rows being spaced apart by distances equal to the spacing between said terminal pads, said supporting surface portions being between said rows, each of said terminals extending normally of said supporting surface portions and having a contact portion on one end thereof which is located beyond said supporting surface portions, so as to engage a contact pad on a substrate supported on said supporting surface portions, each of said terminals extending through, and beyond, said housing, each terminal having a post portion on its other end which is adapted to be soldered to a conductor on said printed circuit board, each of said terminals having a laterally formed section which extends outwardly with respect to said substrate supporting surface portions, and a cover adapted to be assembled to said housing in covering relationship to a substrate on said supporting surfaces, said cover having flanges on the sides thereof, said flanges having surfaces which are engageable with the laterally formed sections of said terminals and being contoured to flex said laterally formed sections inwardly and to subsequently permit said laterally formed sections to return to their normal positions during assembly of said cover member to said housing whereby, upon positioning a substrate on said supporting surfaces and assembling said cover member to said housing, said outwardly formed sections of said terminals are flexed inwardly and outwardly thereby to cause displacement of said contact ends of said terminals over said terminal pads to cause a wiping action of said contact portions on said terminal pads.

7. A connector as set forth in claim 6 including securing means for securing said cover to said housing.

8. A connector as set forth in claim 7 wherein said securing means comprises hinge pin bearing means on said housing at one end thereof and a latch dog on the end thereof which is opposite to said one end, said cover having a hinge pin on one end thereof and having a latch arm on the end thereof which is opposite to said one end whereby, said cover can be assembled to said housing by locating said hinge pin on said bearing means and pivotally moving said opposite end of said cover towards said opposite end of said housing until said latch arm engages said latch dog, said housing and said cover being of molded plastic material, said bearing means and said latch dog being molded integrally with said housing, and said hinge pin and said latch arm being molded integrally with said cover.

* * * * *